(12) United States Patent
Anikitchev

(10) Patent No.: US 7,847,213 B1
(45) Date of Patent: Dec. 7, 2010

(54) METHOD AND APPARATUS FOR MODIFYING AN INTENSITY PROFILE OF A COHERENT PHOTONIC BEAM

(75) Inventor: Serguei G Anikitchev, Belmont, CA (US)

(73) Assignee: Ultratech, Inc., San Jose, CA (US)

( * ) Notice: Subject to any disclaimer, the term of this patent is extended or adjusted under 35 U.S.C. 154(b) by 738 days.

(21) Appl. No.: 11/900,256

(22) Filed: Sep. 11, 2007

(51) Int. Cl.
*B23K 26/00* (2006.01)
*H01L 21/38* (2006.01)
*H01L 21/40* (2006.01)

(52) U.S. Cl. ............... 219/121.61; 219/121.65; 219/121.66; 219/121.73; 372/95; 438/530; 438/795; 438/798

(58) Field of Classification Search ............ 219/121.61, 219/121.65, 121.66, 121.73; 372/95; 438/530, 438/795, 798
See application file for complete search history.

(56) References Cited

U.S. PATENT DOCUMENTS

| | | | | |
|---|---|---|---|---|
| 4,410,237 | A * | 10/1983 | Veldkamp | 359/572 |
| 5,300,756 | A * | 4/1994 | Cordingley | 219/121.69 |
| 5,864,430 | A * | 1/1999 | Dickey et al. | 359/559 |
| 6,103,078 | A | 8/2000 | Hitchems et al. | |
| 6,531,681 | B1 | 3/2003 | Markle et al. | 219/121.8 |
| 6,747,245 | B2 | 6/2004 | Talwar et al. | 219/121.8 |
| 6,884,962 | B2 * | 4/2005 | Lizotte | 219/121.73 |
| 7,253,376 | B2 * | 8/2007 | Zhang et al. | 219/121.73 |
| 7,514,305 | B1 * | 4/2009 | Hawryluk et al. | 438/166 |
| 2004/0173585 | A1 | 9/2004 | Talwar et al. | 219/121.63 |
| 2004/0188396 | A1 | 9/2004 | Talwar et al. | 219/121.65 |
| 2005/0067384 | A1 | 3/2005 | Talwar et al. | 219/121.6 |
| 2005/0103998 | A1 | 5/2005 | Talwar et al. | 250/340 |
| 2006/0255017 | A1 | 11/2006 | Markle | 219/121.62 |

FOREIGN PATENT DOCUMENTS

| | | | |
|---|---|---|---|
| JP | 406252474 A | * | 9/1994 |
| WO | WO 02/14224 A | | 2/2002 |
| WO | WO 05/009596 A | | 2/2005 |

OTHER PUBLICATIONS

International Searching Authority, European Patent Office, International Search Report for International Application No. PCT/US2005/026617, May 12, 2006, Rijswikk.

* cited by examiner

*Primary Examiner*—Samuel M Heinrich
(74) *Attorney, Agent, or Firm*—Allston L. Jones; Peters Verny, LLP

(57) ABSTRACT

A coherent beam source, e.g., a laser having a cavity that is unstable in at least one direction, is used to produce a coherent beam having an initial intensity profile. The beam is passed through a relay having a Fourier plane containing a spatial filter that serves as a radiation defining mask. The filter has an aperture size and shape effective to modify the beam such that the modified beam forms an image on a substrate. The to image has an intensity profile that more closely approximates a super-Gaussian profile than the initial profile. For example, when the initial intensity profile is Gaussian, the spatial filter may allow passage of only unattenuated the central core of the beam and block completely blocks the wings of the Guassian profile. The modified beam may be more suitable for use in a scanning system used to anneal wafers or other substrates containing integrated circuits.

24 Claims, 15 Drawing Sheets

METHOD AND APPARATUS FOR MODIFYING AN INTENSITY PROFILE OF A COHERENT PHOTONIC BEAM

BACKGROUND OF THE INVENTION

1. Field of Invention

The invention relates generally to methods and apparatuses for modifying coherent photonic beams and their intensity profiles. More specifically, the invention relates to such methods and apparatuses that employ a spatial filter to modify photonic beams such as those generated from a laser cavity that is unstable in at least one direction.

2. Description of Background Art

Laser technology is currently being developed to carry out certain thermal processes associated with the fabrication of semiconductor-based microelectronic devices such as processors, memories and other integrated circuits (ICs). For example, the source/drain parts of transistors may be formed by exposing regions of a silicon wafer to electrostatically accelerated dopants containing either boron, phosphorous or arsenic atoms. After implantation, the dopants are largely interstitial, do not form part of the silicon crystal lattice, and are electrically inactive. Activation of these dopants may be achieved by annealing the substrate, e.g., heating the entirety or a portion of the substrate to a particular processing temperature for a period of time sufficient for the crystal lattice to incorporate the impurity atoms into its structure.

In general, it is desirable to anneal semiconductor substrates in a manner that produces well-defined shallow doped regions with very high conductivity. This may be done by rapidly heating the wafer to temperatures near the semiconductor melting point to incorporate dopants at substitutional lattice sites, and then rapidly cooling the wafer to "freeze" the dopants in place. The rapid heating and cooling results in an abrupt change in dopant atom concentration with depth as defined by the implant process. Laser-based technologies are often preferred over conventional heat lamp technologies for annealing because the time scales associated with laser-based technologies are much shorter than those associated with conventional lamps. As a result, thermal diffusion for laser-based annealing processes plays a lesser role in the diffusion of the impurity atoms through the lattice structure than for convention Rapid Thermal Annealing (RTP) technologies employing conventional lamps to heat the wafer surface.

Exemplary terminology used to describe laser-based thermal processing techniques include laser thermal processing (LTP), laser thermal annealing (LTA), and laser spike annealing (LSA). In some instances, these terms can be used interchangeably. In any case, these techniques typically involve forming a laser beam into a long, thin image, which in turn is scanned across a surface to be heated, e.g., an upper surface of a semiconductor wafer. For example, a 0.1-mm wide beam may be raster scanned over a semiconductor wafer surface at 100 mm/s to produce a 1-millisecond dwell time for the heating cycle. A typical maximum temperature during this heating cycle might be 1350° C. Within the dwell time needed to bring the wafer surface up to the maximum temperature, a layer only about 100 to about 200 micrometers below the surface region is heated. Consequently, the bulk of the millimeter thick wafer serves to cool the surface almost as quickly as it was heated once the laser beam is past.

Additional information regarding laser-based processing apparatuses and methods can be found in U.S. Pat. No. 6,747,245 and U.S. Patent Application Publication Nos. 2004/0188396, 2004/0173585, 2005/0067384, and 2005/0103998 each to Talwar et al.

LTP may employ either pulsed or continuous radiation from any of a number of sources. For example, conventional LTP may use a continuous, high-power, $CO_2$ laser beam, which is raster scanned over the wafer surface such that all regions of the surface are exposed to at least one pass of the heating beam. Similarly, a continuous radiation source in the form of laser diodes may be used in combination with a continuous scanning system. Such laser diodes are described in U.S. Pat. No. 6,531,681, entitled "Apparatus Having Line Source of Radiant Energy for Exposing a Substrate", which was issued Mar. 11, 2003 and is assigned to the same assignee as this application.

In general, illumination uniformity (both macro- and micro-uniformity) over the useable portion of the laser beam image is a highly desirable trait. This ensures that the corresponding heating of the substrate is correspondingly uniform. Similarly, the energy delivered from the laser should be generally stable over time, e.g., energy per pulse for pulse radiation applications and laser beam power for continuous radiation applications, so that all exposed regions are successively heated to a uniform temperature. In short, illumination uniformity and stability is generally a desirable characteristic for any laser used for semiconductor annealing applications.

Nevertheless, illumination stability of a laser may vary depending on the laser's design and construction. All lasers contain an energized substance that can increase the intensity of light passing through it. This amplifying medium contains atoms, molecules or ions, a high proportion of which can store energy that is subsequently released as light. Usually, a transmitted beam is "amplified," and the amplifying medium is "pumped" to renew its energy supply. Gaseous amplifying media have to be contained in some form of enclosure. Typically, a laser includes a means of pumping an amplifying medium positioned in an optical cavity, i.e. usually between mirrors that extend the optical path in a specific direction. While the mirrors may be arranged in any of a number of different configurations, the slab configuration, in which planar, parallel mirrors are provided, is often used when $CO_2$ is employed as an amplifying medium. The beam within the cavity undergoes multiple reflections between the mirrors and is amplified each time it passes through the amplifying medium. The purpose of the mirrors is to provide directional feedback.

The laser cavity has several important functions. Following pumping, spontaneous emission of light from excited atoms within the amplifying medium initiates the emission of low intensity light into the laser cavity. This light is increased in intensity by multiple passes through the amplifying medium so that it rapidly builds up into an intense beam along an axis defined by the mirrors. In the absence of cavity mirrors, this preferential direction for the emitted light, would not occur. In addition, the cavity ensures that the divergence of the beam is small.

Usually light amplification occurs within a narrow range of wavelengths depending on the amplifying medium and the properties of the optical cavity in which it is contained. Each of the possible stable modes of oscillation is referred to as a cavity mode. Spatial distributions and wavelengths which do not belong to one or a combination of these special modes of oscillation are rapidly attenuated and will not be present in the output beam.

Powerful gas lasers may have an unstable cavity in at least one direction, e.g., in the lateral direction normal to the applied excitation field. For example, multi-kilowatt $CO_2$ slab lasers with diffusion cooling and RF excitation usually have an unstable cavity in the long slab direction and a stable cavity in the short direction of the slab. Such cavities are called hybrid resonators and are optimized in such a way that they produce the lowest order mode, which has the lowest beam divergence. The lowest order mode of an unstable resonator results in a beam with a "top hat" profile with a deep modulation caused by diffraction effects. Improved beam utilization efficiency for semiconductor applications can be achieved by modifying this beam intensity profile to one more closely resembling a square-wave profile with uniform distribution of intensity.

Thus, opportunities exist in the art to improve the performance of lasers and LTP techniques to overcome the drawbacks associated with known technologies for semiconductor annealing applications.

SUMMARY OF THE INVENTION

A method is provided for modifying a coherent photonic beam having a wavelength, an initial width and an initial intensity profile. A laser, e.g., a $CO_2$ laser, having a cavity that is unstable in at least one direction may be used to generate a single continuous output beam. The beam is passed through a relay having a Fourier plane containing a spatial filter that restricts the beam in the unstable direction. The filter has an aperture size and shape effective to modify the beam such that the modified beam has a modified intensity profile in the unstable direction that more closely approximates a super-Gaussian profile than the initial intensity profile.

Optionally, the laser cavity has an output opening that is defined by parallel sides spaced apart from each other at a distance equaling the initial width of the beam. Such an output opening may be sized, shaped, and positioned to control the initial intensity profile of the beam. In some instances, the initial profile of the beam in the unstable direction is substantially non-Gaussian, e.g., it roughly approximates a flat top with deep oscillations near each edge. In any case, the output opening may ensure that the initial intensity profile or a portion thereof is substantially uniform in a direction that corresponds to an unstable direction of the laser cavity.

Typically, the modified beam is used to form an image, which, in turn, is scanned across a substrate surface. As a result, at least a portion of a substrate at and/or near the surface is heated to achieve a desired temperature within a predetermined dwell time. The desired temperature may be an annealing temperature sufficient to electrically activate dopant atoms implanted into a semiconductor material, e.g., at least about 1200° C. for silicon. The predetermined dwell time may several milliseconds or less. In any case, dwell times and the heating behavior of the substrate may vary. For example, rapid heating may be achieved when the beam is p-polarized and incident to the substrate surface at or near the Brewster's angle.

The beam shape and intensity profile may vary. For example, the modified beam may exhibit an intensity profile having a useful portion of substantially uniform intensity that contains no less than about 15% of total beam energy. In addition, the beam may form an image of an elongate shape, e.g., having a length-to-width ratio greater than 2:1. For a beam that forms an image with an elongate shape, the beam profile may be characterized by the variation in beam intensity along its length. Such an image may be scanned along a path on the substrate surface that is perpendicular to the length of the image.

In another embodiment, a method is provided for processing a semiconductor substrate having a surface. A photonic beam is generated having an initial intensity profile which could be Gaussian and which is imaged onto a substrate with a relay having a spatial filter at a Fourier plane. The size, shape, and location of the spatial filter aperture is effective to diffractively filter the photonic beam to produce an intensity profile that more closely approximates a super-Gaussian than the initial intensity profile along the length of the beam. An image produced from the photonic beam is scanned across the substrate surface to heat at least a portion of the substrate at and/or near the surface to achieve a desired temperature within a predetermined dwell time, D.

In a further embodiment, a method is provided where an initial photonic beam is generated having an initial intensity profile associated with a putative unmodified image unsuitable for scanning across the substrate surface to heat at least a portion of the substrate at and/or near the surface to achieve a desired temperature within a predetermined dwell time. The initial photonic beam is diffracted through a spatial filter at a Fourier plane having an aperture size, shape, and location effective to shape the beam and thereby producing a spatially filtered beam having an intensity profile that is more super-Gaussian like than the initial intensity profile. The spatially filtered beam is scanned across the substrate surface to heat at least the portion of the substrate at and/or near the surface to achieve the desired temperature within the dwell time.

In still another embodiment, a laser-beam apparatus is provided that includes a laser and a relay. The laser has a cavity that is unstable in at least one direction that produces a coherent photonic beam having a wavelength and an initial intensity profile. A portion of the initial intensity profile has a substantially uniform intensity distribution in at least one direction. The relay is positioned for beam pass through and has a Fourier plane containing a spatial filter that has an aperture size and shape effective to modify the initial beam profile. The modified intensity profile at the image plane more closely approximates a super-Gaussian profile than the initial profile.

In yet another embodiment, an apparatus for processing a substrate having a surface includes a radiation source adapted to emit a photonic beam and a stage adapted to support a substrate having a surface. A spatial filter is provided at a Fourier plane in a relay which images the radiation source on the substrate. The spatial filter has an aperture size, shape, and location effective to shape the beam so as to result in a filtered intensity profile that is more super-Gaussian like than the initial intensity profile. A controller is operably coupled to the radiation source and the stage. The controller is programmed to provide relative movement between the stage and the beam to scan the image across the substrate surface to heat at least a portion of the substrate surface to achieve a desired maximum temperature within a predetermined dwell time.

Additional embodiments of the invention will be apparent from the disclosure contained herein.

BRIEF DESCRIPTION OF THE DRAWINGS

FIG. 6A depicts the spectrum of an ideal flat top beam. FIG. 6B depicts the spectrum of an eighth-order super-Gaussian beam.

Figure 1:
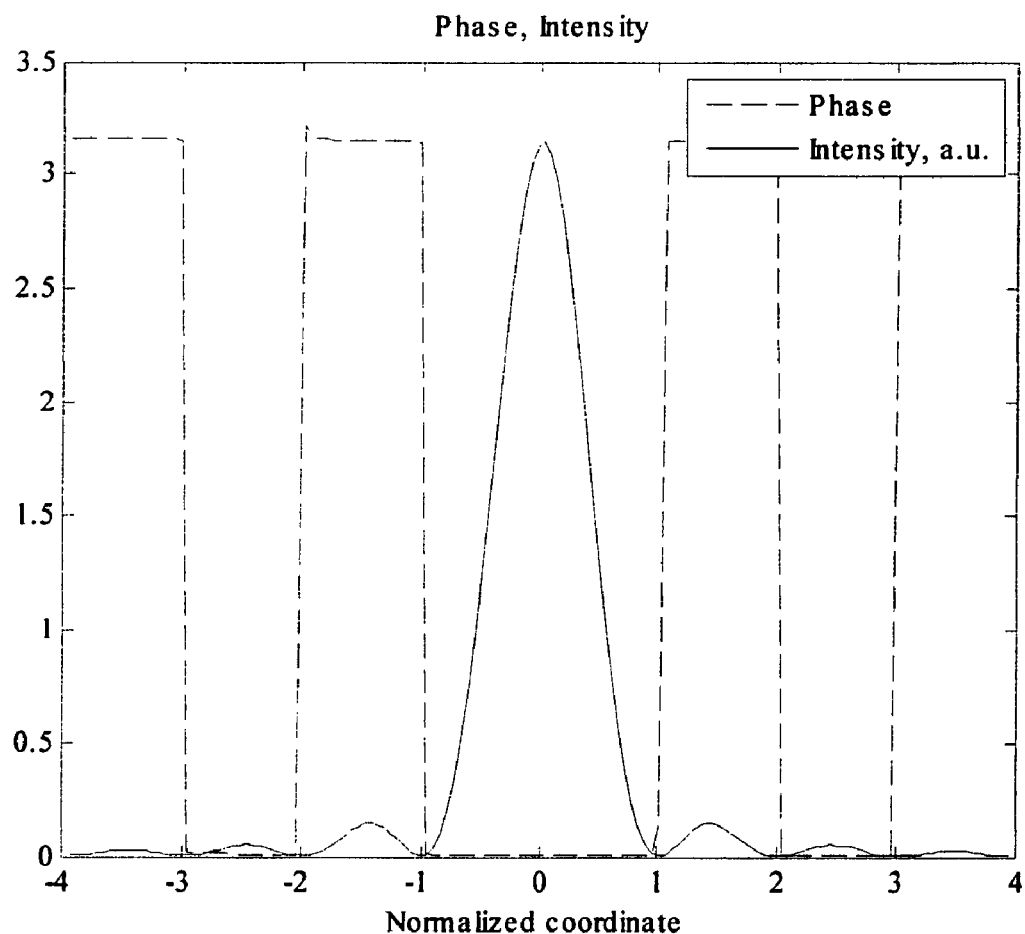
FIG. 1 graphically illustrates in cross-sectional view the intensity and phase profile of a rectangular beam at a Fourier plane.

The drawings are intended to illustrate various aspects of the invention, which can be understood and appropriately carried out by those of ordinary skill in the art. The drawings may not be to scale as certain features of the drawings may be exaggerated for emphasis and/or clarity of presentation.

DETAILED DESCRIPTION OF THE INVENTION

Definitions and Overview

Before describing the present invention in detail, it is to be understood that this invention, unless otherwise noted, is not limited to specific substrates, lasers, or materials, all of which may vary. It is also to be understood that the terminology used herein is for the purpose of describing particular embodiments only, and is not intended to be limiting.

It must be noted that, as used in this specification and the appended claims, the singular forms "a," "an," and "the" include both singular and plural referents unless the context clearly dictates otherwise. Thus, for example, reference to "a beam" includes a plurality of beams as well as a single beam, reference to "a wavelength" includes a range or plurality of wavelengths as well as a single wavelength, and the like.

In describing and claiming the present invention, the following terminology will be used in accordance with the following definitions.

The terms "Brewster's angle" or Brewster angle" is used to refer to the angle of incidence between a radiation beam and a surface that corresponds to the minimum or near-minimum reflectivity of the P-polarized component of the beam. Films on the surface of an object, such as a silicon wafer, may prevent it from exhibiting zero reflectivity at any angle. If, however, the films are dielectric in nature, then there generally will be an angle of minimum reflectivity for P-polarized radiation. Accordingly, the Brewster's angle as used herein for a specular surface formed from a variety of different films stacked on a substrate can be thought of as having an effective Brewster's angle, or the angle at which the reflectivity of P-polarized radiation is at a minimum. This minimum angle typically coincides with or is near the angle of the Brewster's angle for the substrate material.

The term "intensity profile" in reference to an image or a beam refers to the distribution of the integrated radiation intensity along one or more dimensions. For example, an image may have a useful portion and a non-useful portion. The useful portion of an image typically has a "uniform" or constant integrated intensity profile over some portion of its length. In other words, the intensity profile integrated in the scan direction throughout the useful portion of the image may be substantially constant. Accordingly, any point on a substrate surface region that is scanned by a useful portion of an image having a uniform intensity profile will be heated to the same temperature. However, the intensity or intensity profile of the non-useful portion may differ from that of the useful portion. Thus, the image as a whole may have an overall "non-uniform" intensity profile even though a useful portion by itself may exhibit a uniform intensity profile.

As a related matter, the term "peak intensity value" of an image or a beam refers to the point along the beam length exhibiting the highest integrated intensity across the beam width. Typically, the entirety of the useful portion of an image will exhibit an integrated intensity very close to the peak integrated intensity.

As another related matter, the term "energy utilization" as in the "energy utilization of an image" refers to the proportion of energy associated with the portion of the image useful for producing a desired effect relative to the total beam energy in the image. For example, in an annealing application the "useful portion" of an image may be only that part of the beam that comes within about a percent or two of the maximum or peak beam intensity. In such a case, the "useful portion" exhibits a "substantially uniform" intensity. A small modification to the image profile shape can produce a large change in the "energy utilization."

The term "semiconductor" is used to refer to any of various solid substances having electrical conductivity greater than insulators but less than good conductors, and that may be used as a base material for computer chips and other electronic devices. Semiconductors include elements such as silicon and germanium and compounds such as silicon carbide, aluminum phosphide, gallium arsenide, and indium antimonide.

Unless otherwise noted, the term "semiconductor" includes any one or a combination of elemental and compound semiconductors, as well as strained semiconductors, e.g., semiconductors under tension or compression. Exemplary indirect bandgap semiconductors suitable for use with the invention include Si, Ge, and SiC. Direct bandgap semiconductors suitable for use with the invention include, for example, GaAs, GaN, and InP.

The terms "substantial," and "substantially" are used in their ordinary sense and refer to matters that are considerable in importance, value, degree, amount, extent or the like. For example, the phrase "substantially Gaussian in shape" refers to a shape that corresponds predominantly to the shape of a Gaussian probability distribution curve. However, a shape that is "substantially Gaussian" may exhibit some characteristics of a non-Gaussian curve as well, e.g., the curve may also include a non-Gaussian component.

Similarly, a "substantially uniform" intensity profile will contain a relatively flat portion where the intensity does not deviate more than a few percent from the profile's peak intensity. Preferably, the intensity deviation is less than about 2%. Optimally, the intensity deviation is no more than about 1% or no more than about 0.8%. Other uses of the term "substantially" involve an analogous definition.

The term "substrate" as used herein refers to any material having a surface, which is intended for processing. The substrate may be constructed in any of a number of forms, for example, such as a semiconductor wafer containing an array of chips, etc.

In general, the invention involves processing methods, apparatuses and systems that use a spatial filter at a Fourier plane so as to modify a coherent photonic beam. As a result of spatial filtration, however, the beam intensity is modified so as to exhibit a more super-Gaussian profile. The beam may then be advantageously used to carry out thermal processing of semiconductors, e.g., rapidly heating a wafer to electrically activate dopant atoms implanted therein. Since a beam exhibiting a super-Gaussian intensity profile has a proportionally greater portion of substantially uniform intensity, the energy utilization of the beam may be increased.

The invention is particularly suited for applications that involve the use of high-power lasers having a laser cavity that is unstable in at least one direction. The intensity profile may vary over time. By aligning the spatial filter with the unstable direction or directions of the laser cavity, undesirable temporal variations in beam intensity may be reduced.

For example, high-power $CO_2$ lasers, e.g., having a power of at least 250 W, 1000 W, or 3500 W, may be used to generate an image, which, in turn, is scanned across a surface of a substrate to effect rapid thermal processing, e.g., melt or non-melt processing, of the substrate surface. Such power levels may provide exposure energy doses of at least about 60 $J/cm^2$ over a 1 ms dwell time. Longer dwells require higher energies. The wavelength of the $CO_2$ laser, $\lambda$, is 10.6 µm in the infrared region, which is large relative to the typical dimensions of wafer features, and is therefore uniformly absorbed as the beam scans across a patterned silicon wafer with the result that each point on the wafer is raised to very nearly the same maximum temperature.

Those of ordinary skill in the art will recognize that great care must be taken to address to certain operational issues relating to the practice of the invention using powerful lasers to realize the full benefit of the invention. Such operational issues include, for example, the directionality, intensity profile, and the phase profile stability of the pre-filtered beam. While beam shaping techniques using aspherical optics may also be used to extend a "flat" portion of a beam's intensity profile, the invention tends to be less sensitive to beam perturbations and imperfections in the optics transmitting the beam.

Coherent Beam Production and Shaping

To elucidate the novel and nonobvious aspects of the invention, theoretical and practical aspects of coherent laser beam production and modification are discussed below. In particular, the discussion focuses on output beams from lasers with unstable cavities and filtration thereof.

In general, high power lasers with unstable cavities are employed with great success whenever a high-quality radiation beam is essential. For example, a multi-kilowatt $CO_2$ slab laser may be used in applications that employ diffusion cooling and radio frequency (RF) excitation. Such lasers may include hybrid resonators (wave-guided and stable in one direction and unstable cavities in the long direction of the slab). Resonators may be optimized in such a way that they tend to only produce the lowest order mode, which has lowest divergence. The lowest order mode of an unstable resonator has a spherical or planar wave front with a more or less uniform distribution of intensity over the cross-section of the output beam. Such a distribution of intensity and phase is known in the art as a "flat-top" profile.

In many applications, flattop beams are undesirable because focused beams with a flat top profile produces strong secondary diffraction maximums. FIGS. 1, 3, 4, and 5 show modeling data that illustrate diffraction profiles some of which exhibit secondary diffraction maximums. In particular, FIG. 1 graphically depicts the intensity and phase profile cross-section at a Fourier plane for a rectangular beam, i.e., a beam with a square top profile. The intensity profile (in arbitrary units) is shown in a solid line, whereas the phase relative to the beam axis is shown in a dotted line. In FIG. 1, the abscissa on the graph are normalized to parameter, $P=\lambda f/2a$, where $\lambda$ is wavelength of radiation, 2a is a full width of the beam profile, and f is a focal length of a focusing optic.

Figure 2:
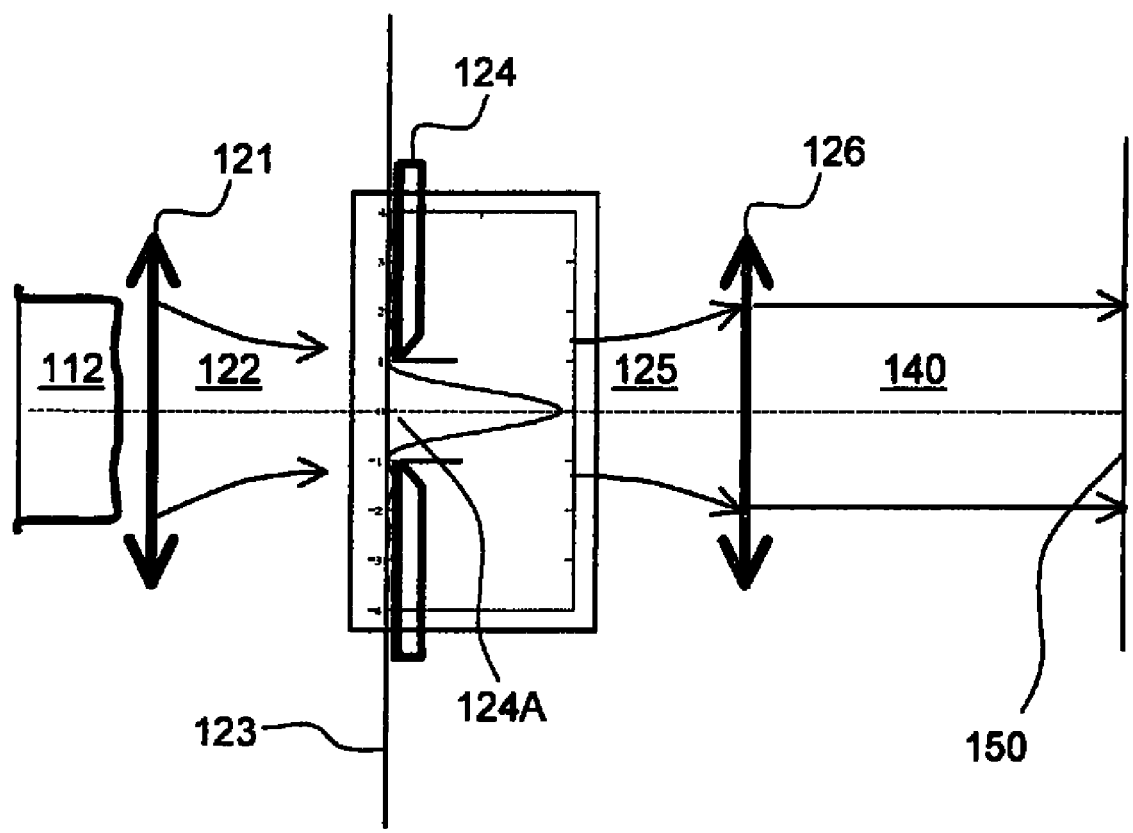
FIG. 2 schematically depicts a spatial filter layout for using a spatial filter to modify the intensity profile of an input beam so as to produce a Gaussian output beam.

A schematic of a typical relay adapted for spatial filtering is shown in FIG. 2. The relay images an intensity distribution provided by the laser, such as the rectangular distribution shown by curve 112, onto the substrate. In so doing the relay provides a pupil or Fourier plane that can be used very effectively to modify the intensity distribution on the substrate. In its simplest form the relay consists of two optical elements, which may be lenses or mirrors, and which focus the apertures which define the lateral extent of the beam within the laser onto the substrate 150. The first relay optical element, 121, the focuses output beam 112 from the laser at a Fourier plane 123. The second optical element 126 images the Fourier plane at infinity. Thus focal plane 123 is a Fourier transform of the laser output distribution 12 and the substrate plane 150 is a Fourier transform of pupil plane 123.

Figure 3:
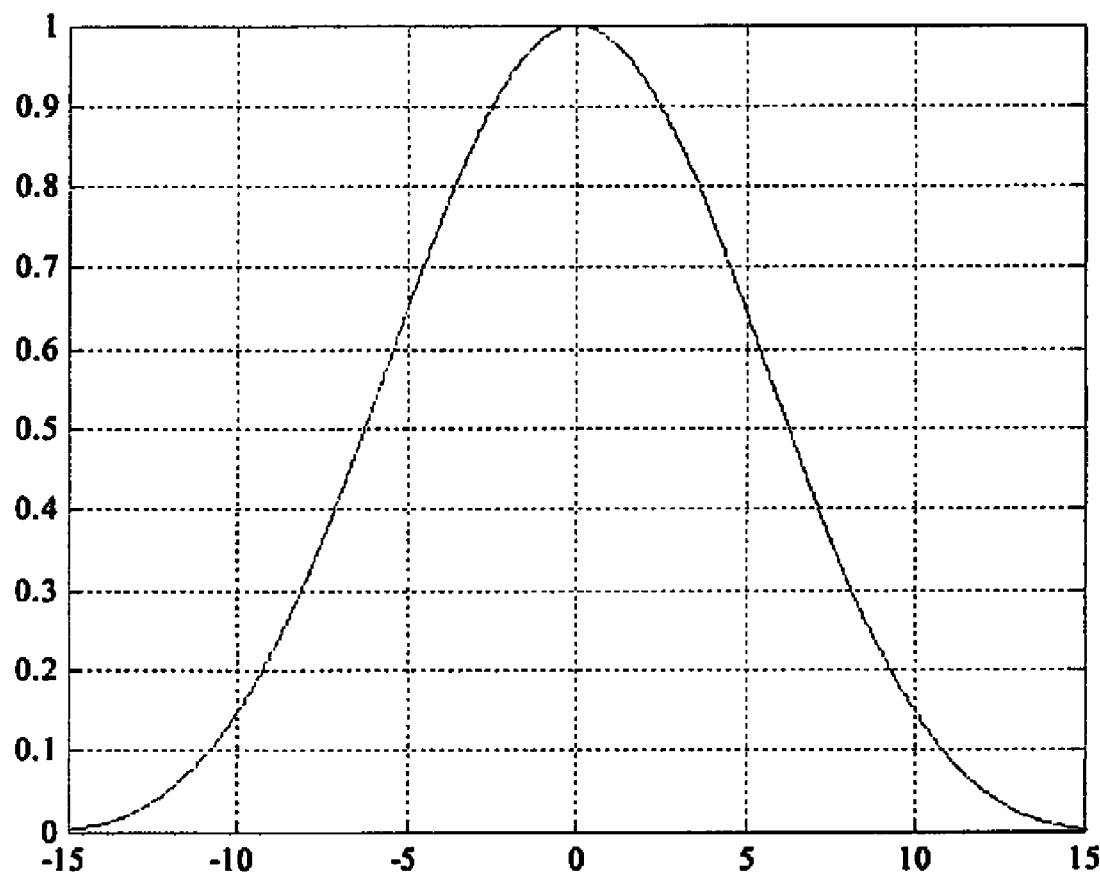
FIG. 3 graphically depicts a Gaussian profile of a filtered beam produced by the setup shown in FIG. 2 at the output or substrate plane.
Figure 4A:
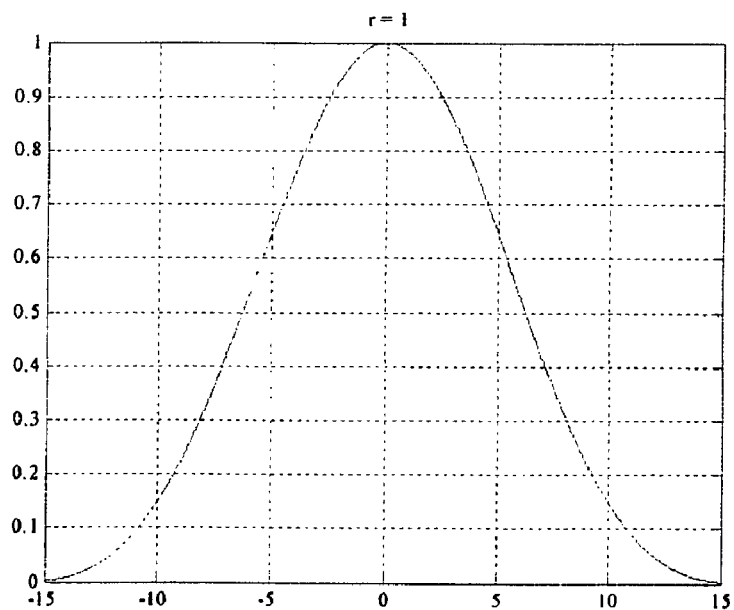
FIGS. 4A-4D, collectively referred to as FIG. 4, graphically depict the cross-sectional intensity profiles that result from beam filtration using apertures of different integer r sizes (r=1, 2, 3, and 4) at the output or substrate plane.
Figure 4B:
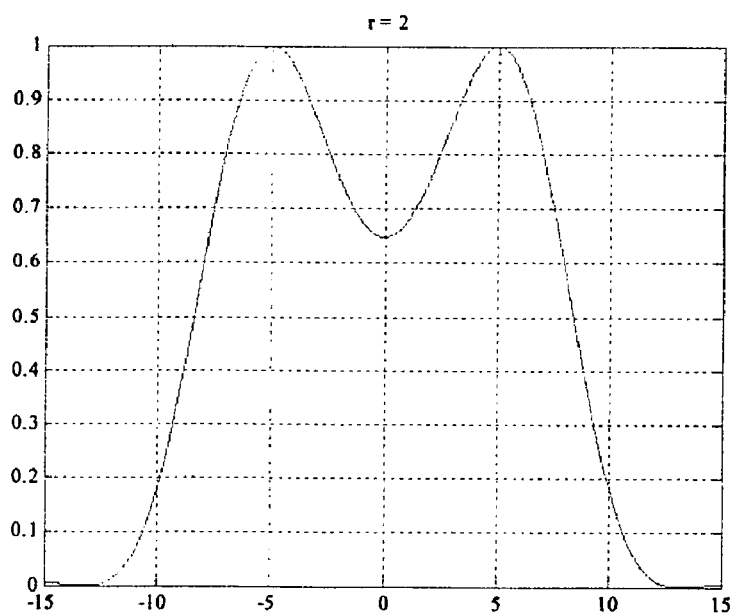
Figure 4C:
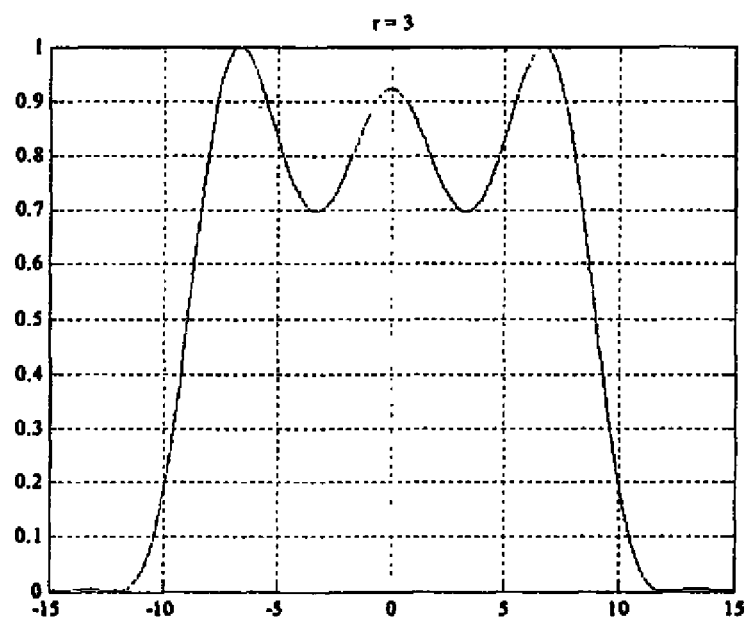
Figure 4D:
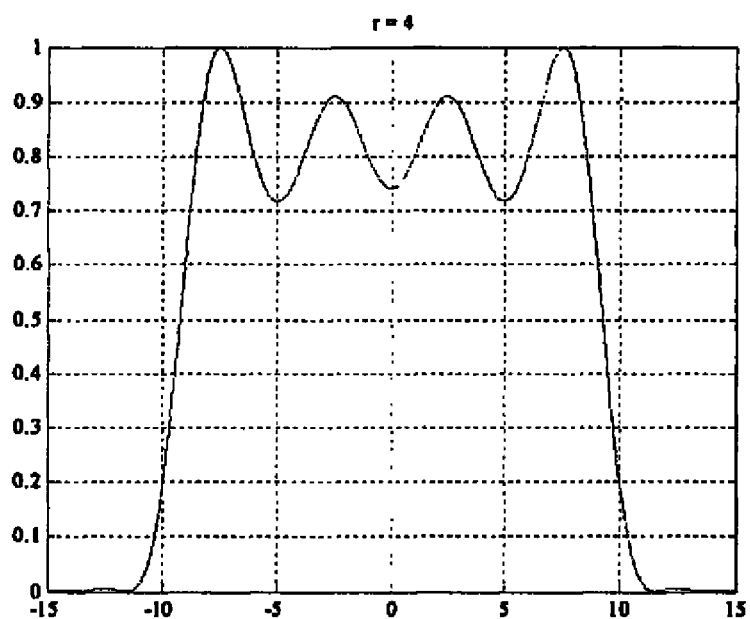
Figure 5A:
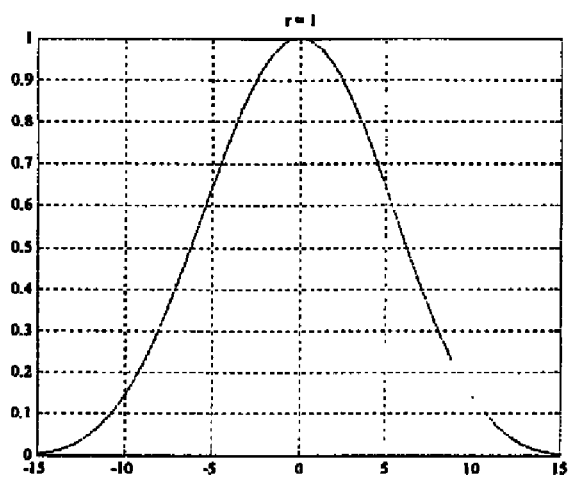
FIGS. 5A-5I, collectively referred to as FIG. 5, graphically depict the cross-sectional intensity profiles that result from beam filtration using apertures of different integer and non-integer r sizes (r=1, 1.2, 1.4, 1.43, 1.5, 1.7, 2.0, 2.2, and 2.4).
Figure 5B:
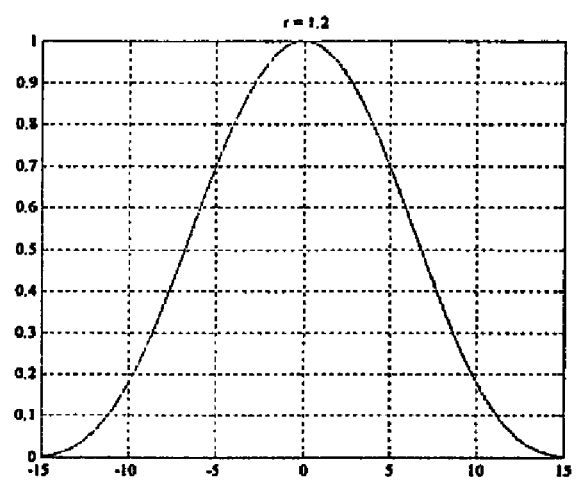
Figure 5C:
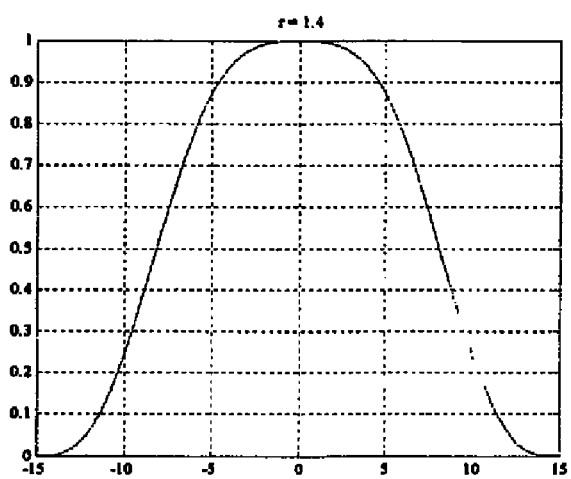
Figure 5D:
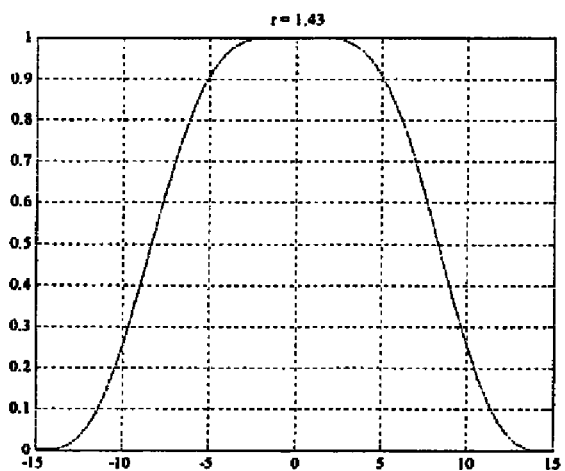
Figure 5E:
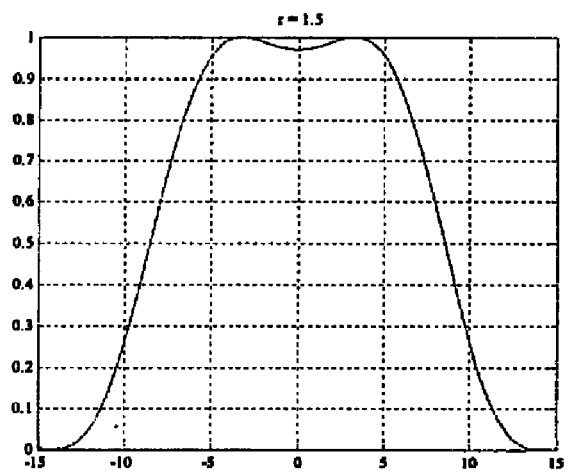
Figure 5F:
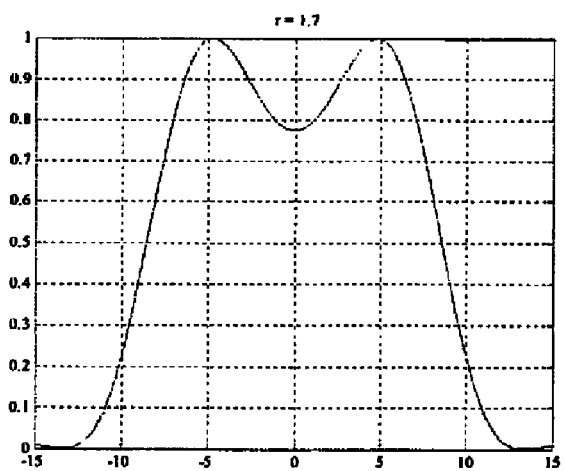
Figure 5G:
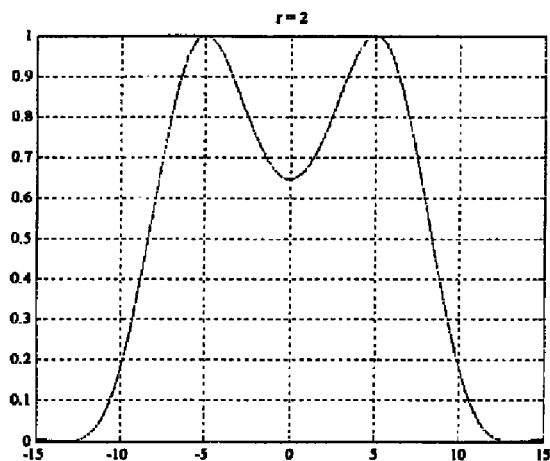
Figure 5H:
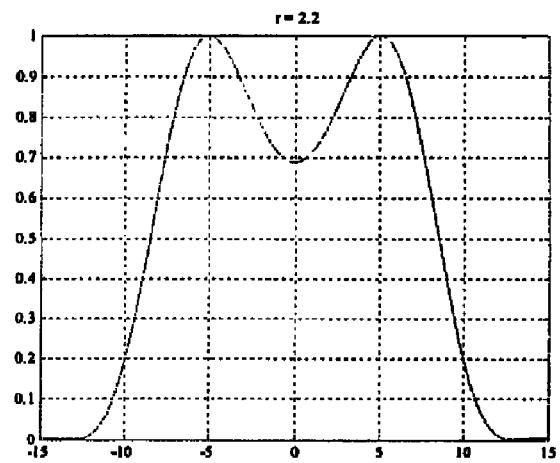
Figure 5I:
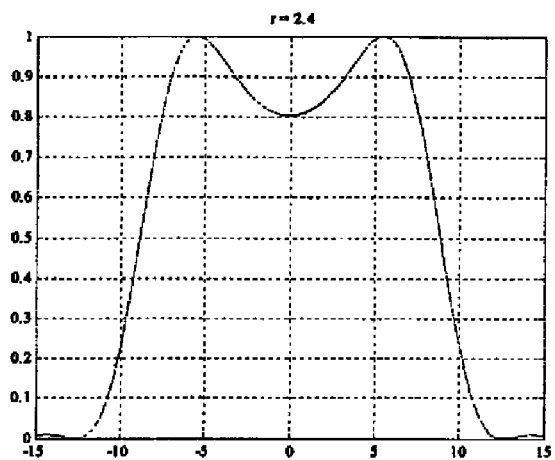

Typically, the focused radiation 122 is spatially filtered by an aperture 124A of a filter 124 installed at a Fourier plane 123 so only the main maximum of the intensity distribution is transmitted through the aperture. This provides for diffraction "clean up" of the incident beam 122. As a result, transmitted radiation 125 exhibits a substantially Gaussian intensity profile. Thus a beam profile approximating a Gaussian profile can be produced through spatial filtering. The resultant beam profile of such a transformation at the output or substrate plane is shown in FIG. 3.

Such diffractive filtration techniques may also be used to reshape coherent laser beams with flattop or close to flattop profiles into super-Gaussian beams. Through review of the following example involving beams of rectangular symmetry, those of ordinary skill in the art should be able to reshape beams of any shape, e.g., beams with circular symmetry, so that their intensity profile is more super-Gaussian like.

As discussed above in reference to FIG. 1, the size of an aperture, r, may be described in terms of its size in relation to the parameter P. That is, r/P=x where x is the ratio between the size of an aperture and the separation of the diffraction minima from a rectangular aperture. When a spatial filter is set up to provide a Gaussian output intensity profile, r=1. When r is an integer, r indicates how many maxima of the diffraction pattern may be transmitted through the aperture. For example: when r=1, one (main) maximum may be transmitted; r=2 corresponds to three maxima; r=3 corresponds to five maxima; and so on.

With reference FIG. 2, changes in the size of aperture 124 alter the intensity and phase profile in the second Fourier plane 126. Result of such a manipulation for r=1, 2, 3, and 4 shown in FIG. 4, where the intensity profile of the resulting beam at the output or substrate plane is plotted in a solid line and the phase profile is shown as dotted lines.

In any case, any beam obtained with aperture r≠1 does not correspond to an eigenmode of free space. This means that the beam intensity distributions change when the beams propagate away from the second Fourier plane. In the exemplary system shown in FIG. 2, a 1:1 telescope is employed. However, the system may be modified to have any other magnification, which would change size of the beams and location of the second Fourier plane.

FIG. 5 shows various intensity profiles for beams filtered by an aperture corresponding to integer and non-integer values of r. The graphs in FIG. 5 show that by changing opening of the slit (aperture 124), non-Gaussian distributions of intensity with extended flat portions of intensity profiles are created. See, e.g., r≈1.4, r≈1.43, etc. The flat portions of the beam can be relayed with proper magnification to a substrate, e.g., a semiconductor wafer, for processing in applications where uniformity of exposure is required or preferred. It has been calculated that r≈1.43 results in a fairly flat top profile.

Figure 6A:
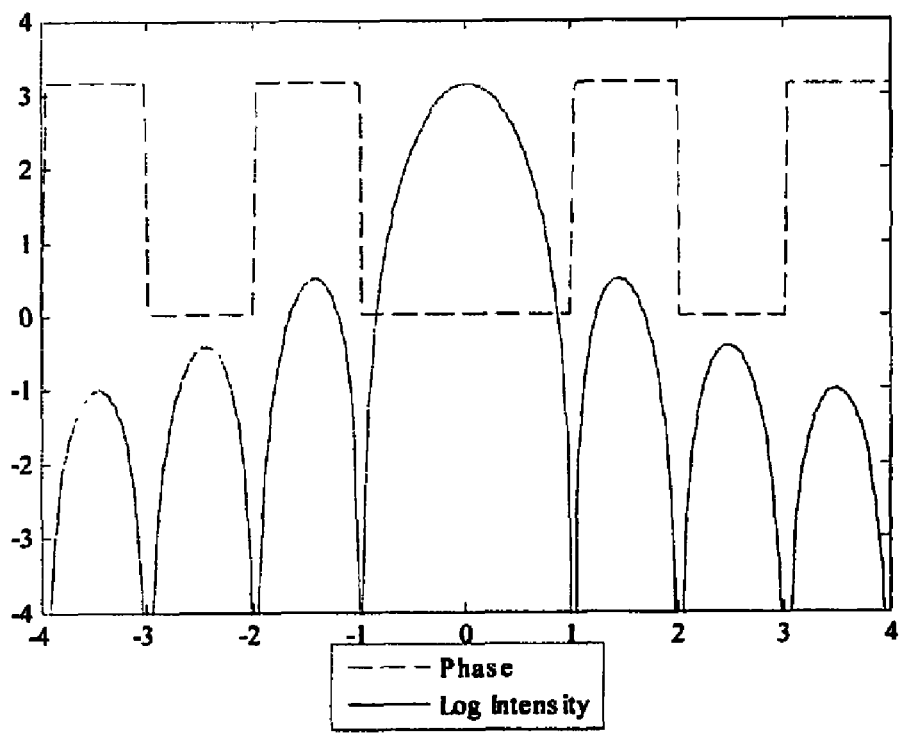
FIGS. 6A and 6B, collectively referred to as FIG. 6, graphically depict angular beam spectra.
Figure 6B:
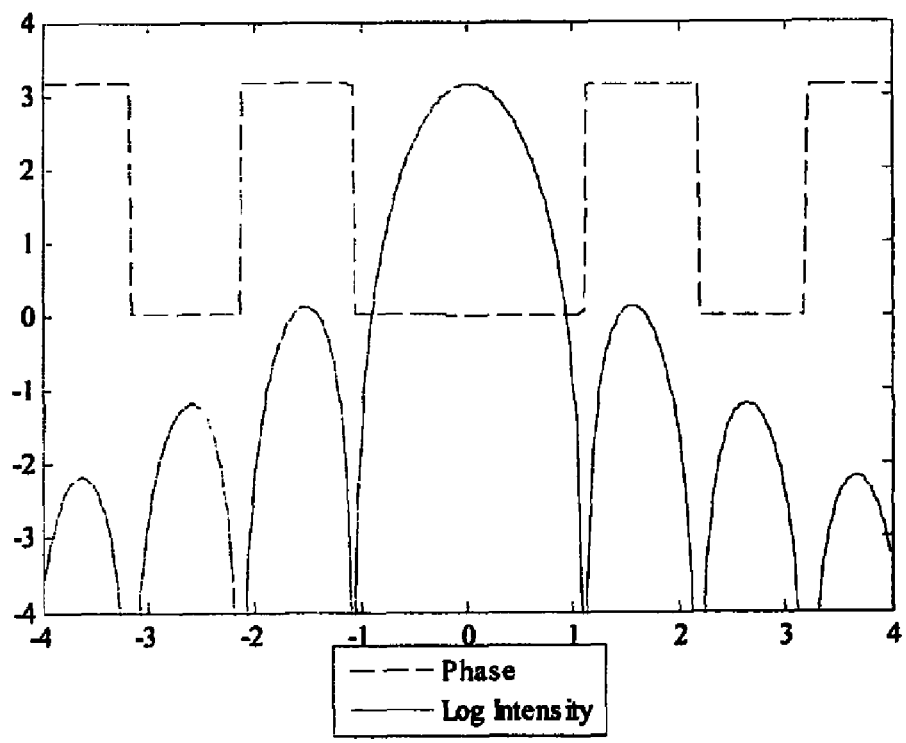

Laser beams with a high-order super-Gaussian profile are preferred for many rapid thermal semiconductor processing applications since they provide for extended flattop regions and render the process more power efficient. In order to elucidate how a high-order Super Gaussian Beam (SGB) can be generated, FIG. 6 compares the angular spectra of an ideal flat top beam (FIG. 6A) and an high-order super-Gaussian beam (FIG. 6B) obtained in a focal plane of a lens with NA=0.05. In FIG. 6, the angular spectra abscissa is normalized to the width of the central lobe in both cases. Comparison of the two cases shows that the super-Gaussian beam spectrum is an apodized version of the ideal flat top: high spatial frequencies are suppressed compared to the spectrum of flat top. Zeros of the two distributions do not coincide exactly as well.

From FIG. 6, it follows that there is no a simple function-multiplier, which would transform one spectrum to another. However, it is possible to construct an apodizing function, which will approximately transform a flattop beam (output of unstable cavity) into super-Gaussian one. This function should suppress high-order components of the spectral distribution (to smooth out the edges) and balance positive and negative lobes of distribution in order to flatten the distribution close to the optical axis.

Agreement Between Experimental Results and Modeling Data

With the current state of the art, high-power lasers do not generally generate beams with perfectly controllable distributions. For example, an experiment was carried out using a laser having a hybrid (waveguide-unstable) cavity. The intensity distribution of a beam produced from such a laser was measured at a distance of approximately one meter from the laser. Typically, the intensity profile of a beam generated from such a laser is observed to be Gaussian in one direction and a corrupted flattop in the perpendicular direction. Diffraction fringes were also observed. Such fringes appear to result from diffraction from the edges of the output opening.

Figure 7:
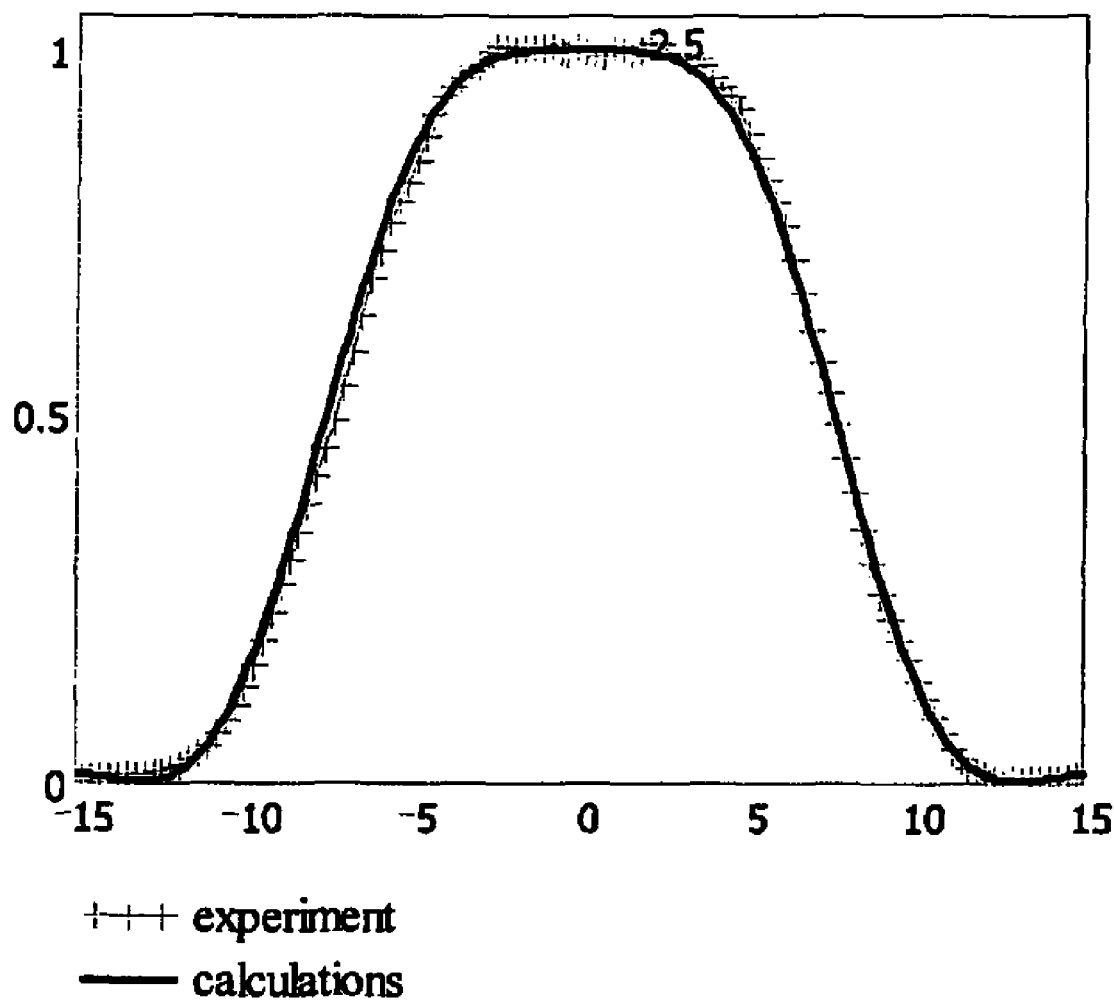
FIG. 7 graphically depicts the experimental and theoretical intensity profiles of a beam associated with r≈1.4.

However, further experiments were carried out using generally the same laser but with spatial filtering with an adjustable hard-edged aperture. For example, a filter having r≈1.4 was used. Despite the asymmetry of the input beam's initial intensity distribution, the modified intensity distribution of the output beam showed good symmetry. As shown in FIG. 7, the actual intensity distribution produced generally agrees with the modeling results discussed above.

Exemplary Apparatus

Figure 8:
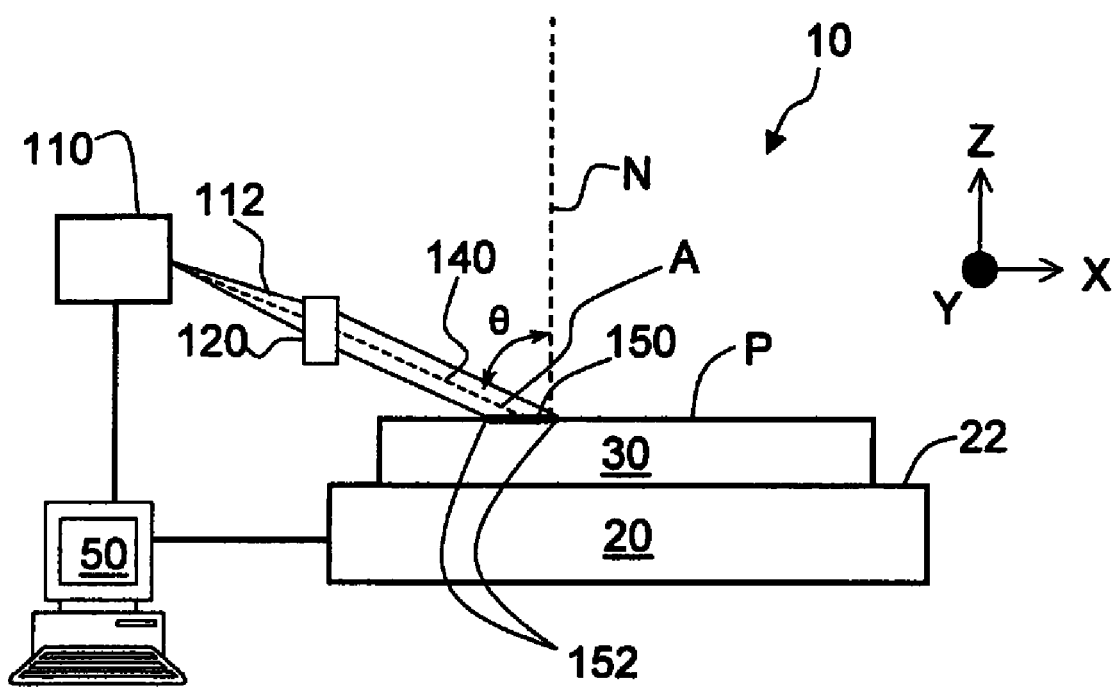
FIG. 8 shows the main components of a laser annealing system employing the beam apodization scheme described herein.

The invention may be used to form apparatuses for carrying out rapid thermal semiconductor processing. For example, FIG. 8 is a schematic diagram of a simplified exemplary embodiment of a thermal processing apparatus 10 that may be used to anneal and/or otherwise thermally process one or more selected surface regions of a substrate according to the present invention. LTP system 10 includes a movable substrate stage 20 having an upper surface 22 that supports a semiconductor substrate 30 having an upper surface P. Substrate stage 20 is operably coupled to controller 50. Substrate stage 20 is adapted to move in the X-Y plane under the operation of controller 50 so that the substrate can be scanned relative to the image generated from radiation provided by radiation source 110.

The radiation source 110 is operably coupled to controller 50, and an optical system 120 that serves to produce from radiation generated by the radiation source one or more beams that are in turn imaged on the substrate. In an exemplary embodiment, radiation source 110 is a $CO_2$ laser that emits radiation at a wavelength $\lambda_H$~10.6 μm in the form of a beam 112 that has an intensity profile that is, without modification, unsuitable for annealing the substrate. However, the radiation suitable for use with the invention may include LED or laser diode radiation as well, e.g., radiation having a wavelength of about 0.8 μm. Optionally, a plurality of radiation sources may be employed. As shown, the laser 110 generates an input beam 112 that is received by an optical system 120 that is adapted to manipulate the input beam to produce an output beam that forms an image on the substrate that exhibits an intensity profile, the useful portion of which is uniform.

The optical system 120 transforms the input beam 112 into output beam 140. The optical system is constructed in a manner consistent with the above-described principles and techniques for coherent beam shaping. The optical system 120 and the radiation source 110 in combination should systemically stabilize, the directionality, intensity profile, and phase profile of the output beam so as to produce a consistently reliable laser annealing system.

Beam 140 travels along optical axis A, which makes an angle θ with a substrate surface normal N. Typically, it is not desirable to image a laser beam on a substrate at normal incidence, because any reflected light may cause instabilities when it returns to the laser cavity. Another reason for providing optical axis A at an incident angle δ other than at normal incidence, is that efficiently coupling of beam 140 into the substrate 30 may best be accomplished by judicious choice of incident angle and polarization direction, e.g., making the incident angle equal to the Brewster's angle for the substrate and using p-polarized radiation. In any case, the stage may be adapted to scan the substrate through the beam position while preserving the incident angle.

Beam 140 forms image 150 at substrate surface P. In an exemplary embodiment, image 150 is an elongate image, such as a line image, having its lengthwise boundaries indicated at 152, and located within a plane containing the incident beam axis and the surface normal. Accordingly, the incident angle of the beam (θ) relative to the substrate surface may be measured in this plane.

The controller may be programmed to provide relative movement between the stage and the beam. As a result, the image may be scanned across the substrate surface to heat at least a portion of the substrate surface. Such scanning may be carried out in a manner effective to achieve a desired temperature within a predetermined dwell time, D. Scanning may typically be performed in a direction that is orthogonal to the lengthwise axis of the image although this is not a firm requirement. Non-orthogonal and non-parallel scanning may be carried out as well. A means may also be included to provide feedback as to the uniformity in maximum temperature achieved. Various temperature measuring means and methods may be used with the invention. For example, a detector array might be used to take a snap-shot the emitted radiation distribution over the surface or multiple snap-shots might be used to derive a map of the maximum temperature as a function of the position across the length of the beam image. Optionally, a means for measuring the intensity profile of the beam on the substrate may be used as well.

Optimally, a real-time temperature measurement system may be employed that can sense the maximum temperature with a spatial resolution preferably comparable to the thermal diffusion distance and with a time constant less than or preferably comparable to the dwell time of the scanned beam. For example, a temperature measurement system may be used that samples the emitted radiation 20,000 times a second at 256 points spread evenly over a 20 mm line-image length. In some instances, 8, 16, 32, 64, 128, 256, 512, or more distinct temperature measurements may be made at a rate of 100, 1000, 10,000, 50,000 line scans per second. An exemplary temperature measurement system is described in U.S. Patent Application Publication No. 2006/0255017, entitled "Methods and Apparatus for Remote Temperature Measurement of a Specular Surface", published on Nov. 16, 2006. Such temperature measurement systems may be used to provide input to the controller so that appropriate corrections can be made possibly by adjusting the radiation source, the optical system or the scanning velocity.

Beam Reshaping Variations

It should also be noted that the invention is not limited to instances involving flattop (or close to flattop) distributions of the input intensity profile or particular lasers. The invention may be applied to any coherent beam truncated so as to have a sign alternating electric field distribution in a Fourier plane. Such a beam can be created for example, from a Gaussian beam by passing it through a rectangular or one-dimensional aperture that clips a substantial part on either side of the Gaussian beam and then observing the resultant intensity distribution in the Fourier plane of a relay that images the truncated Gaussian beam onto the substrate.

Figure 9:
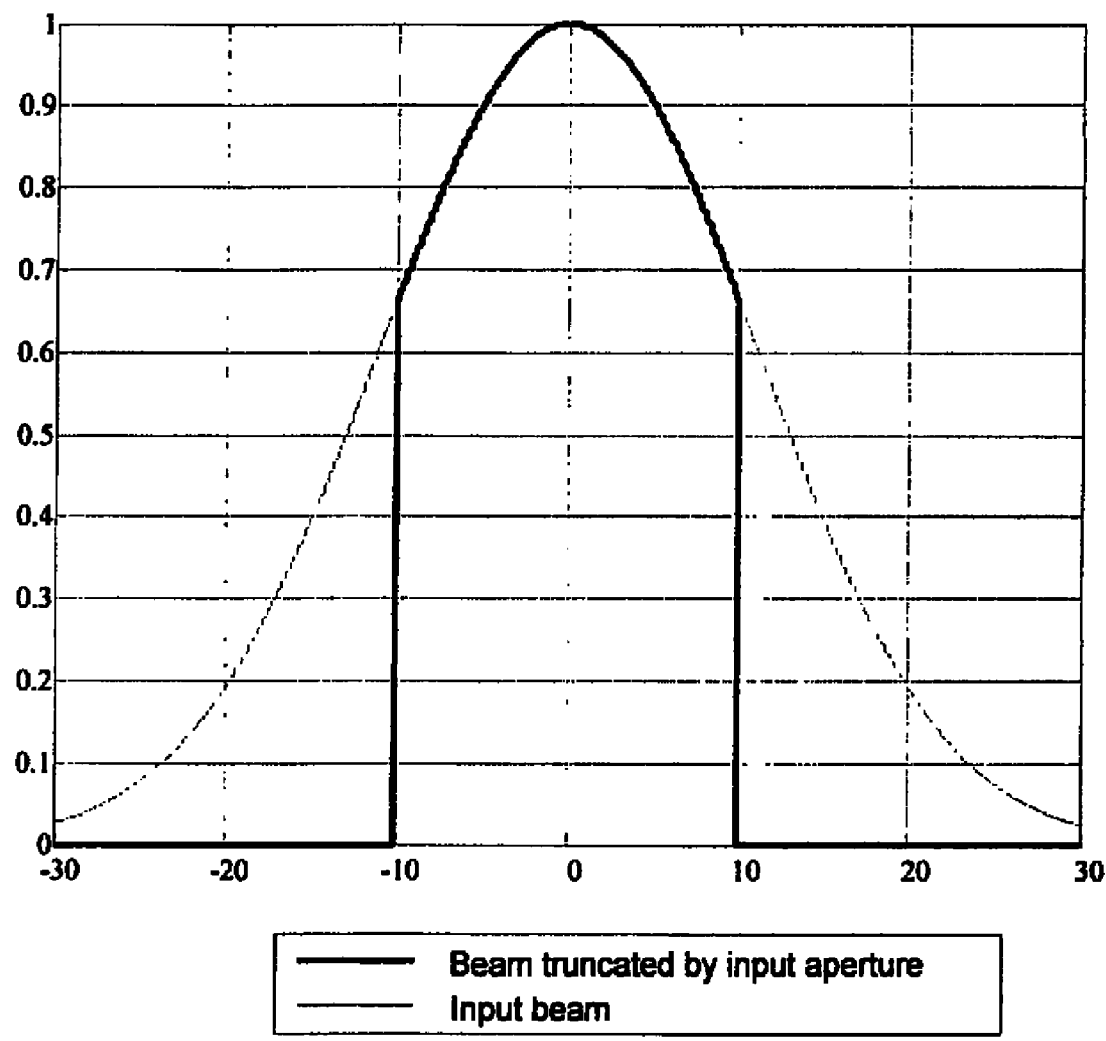
FIG. 9 shows how a Gaussian beam might be truncated at the 65% of maximum intensity.
Figure 10:
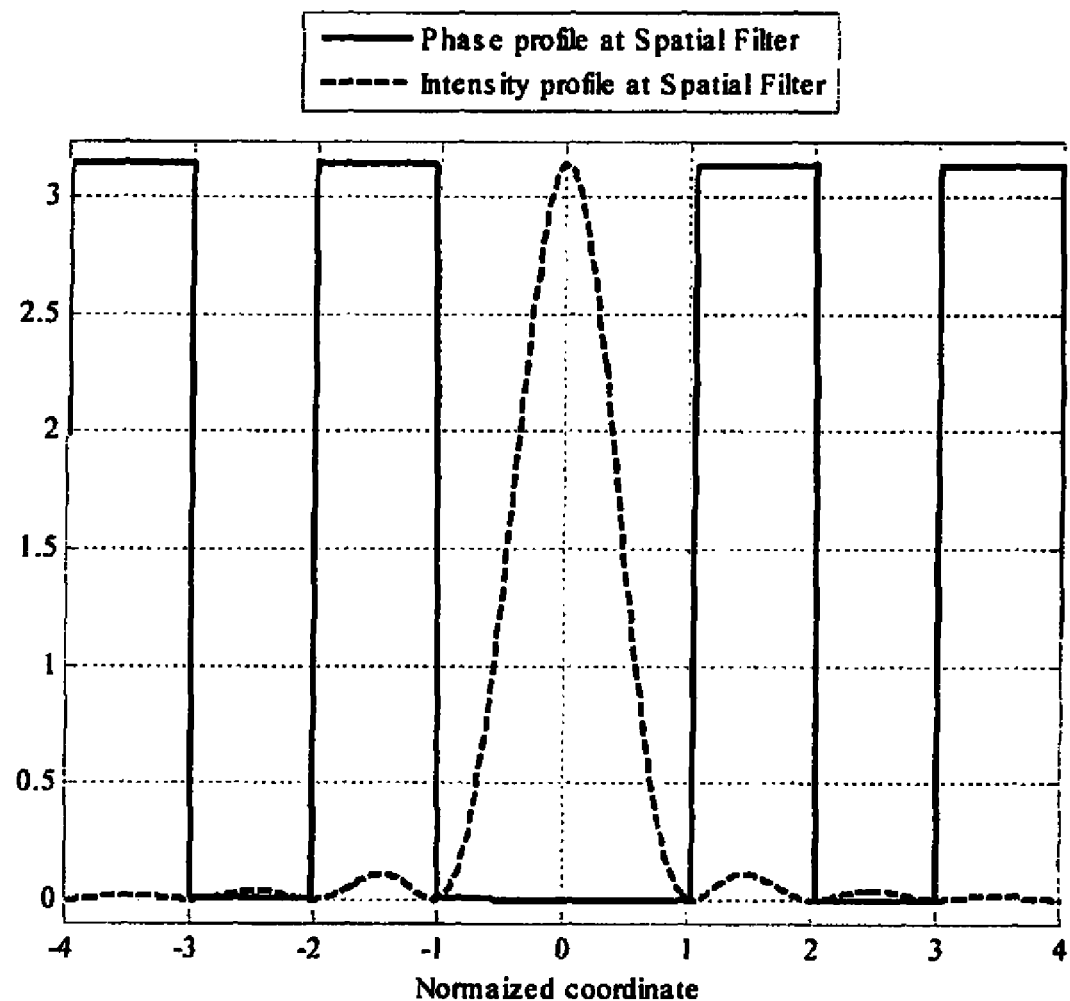
FIG. 10 shows the alternating electric field distribution in the Fourier plane for the truncated input beam shown in FIG. 9
Figure 11:
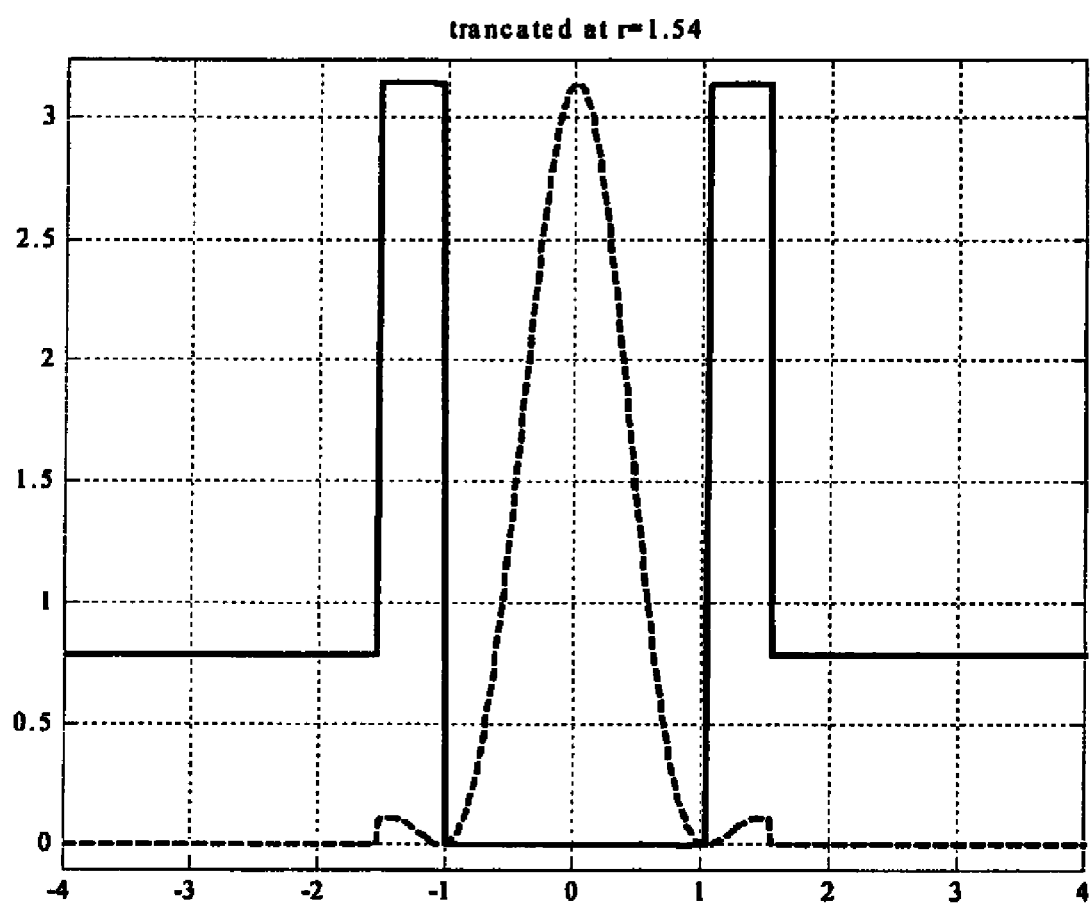
FIG. 11 shows the alternating electric field distribution in the Fourier plane for a "top hat" input beam.
Figure 12A:
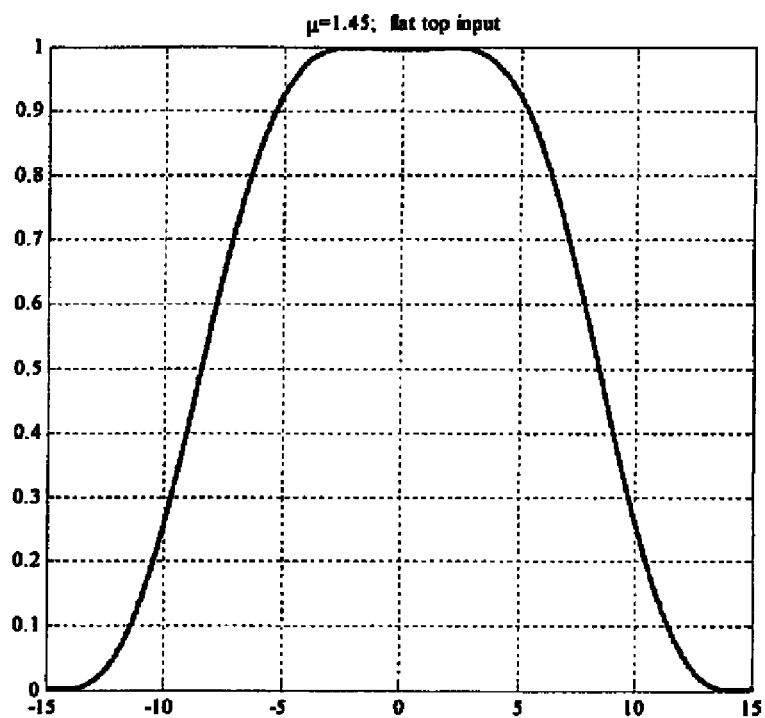
FIGS. 12A and 12B, collectively referred to as FIG. 12, show the result of super-Gaussian reshaping of a "top hat" and Gaussian input beams, respectively.
Figure 12B:
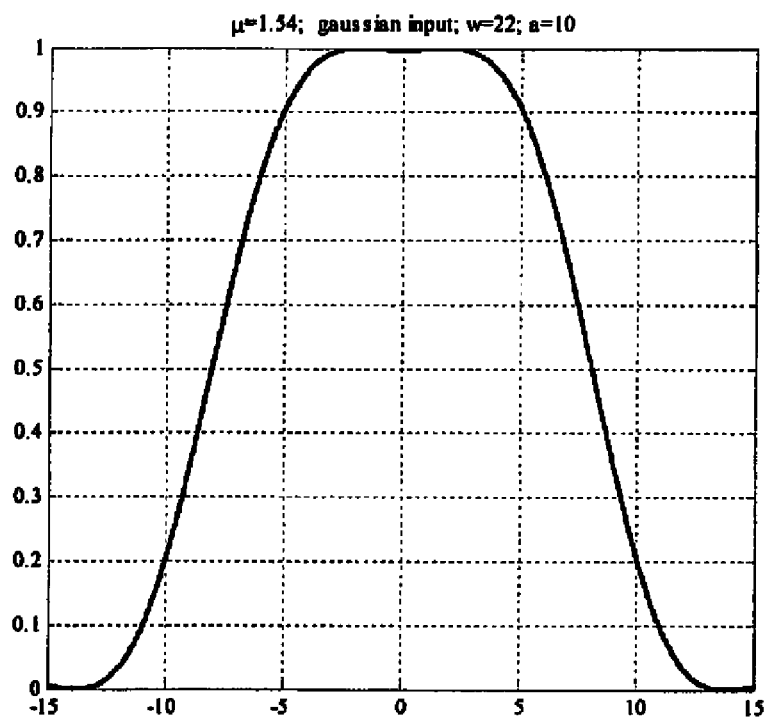

FIG. 9, for example, shows how a Gaussian beam from a $CO_2$ laser with a stable cavity may be truncated at 65% of the maximum intensity level of the beam. FIG. 10 shows the alternating electric field distribution in the Fourier plane that results. This corresponds roughly to the intensity distribution shown in FIG. 1. With respect to a "top hat" beam; spatial filter in the Fourier plane is depicted in FIG. 11 as having with its edges located the r=±1.54 points. The super-Gaussian intensity distribution at the substrate image plane as shown FIG. 12A is similar to that shown in FIG. 12B. Accordingly, it should be apparent that similar results are obtainable regardless whether one starts with a beam having a flat top or a Gaussian initial intensity profile.

It will be apparent to those of ordinary skill in the art that the invention may be practice to modify a beam of any intensity profile to exhibit a super-Gaussian intensity profile. It will also be apparent that the invention may be practice using almost any radiation source having a minimum coherence length that may be determined upon routine experimentation. Important variables to the practice of the invention include: the width of the spatial filter that defines the extent of the source that is imaged onto the substrate by the relay; and the width of the spatial filter in the Fourier plane of the relay that clips the wings of the alternating field distribution created by the source defining filter. The optimum size of these two spatial filters depends on the intensity distribution generated by the source.

While a few initial intensity profile have been described herein in detail, the invention is not limited to flat or Gaussian initial intensity profiles. It should be apparent that the invention can also be applied to almost any source distribution including the application of two-dimensional spatial filters to produce two-dimensional super-Gaussian profiles having square, circular or elliptical symmetry.

One practical advantage exhibited by this invention is that one, two, or more spatial filters are easily fabricated being either totally transmissive or totally opaque and having an opening that is either rectangular, round or elliptical. The filters may be made of metal and therefore can be easily cooled if they are employed with a high power radiation source.

Additional variations of the present invention will be apparent to those of ordinary skill in the art. For example, the optical system of the invention may employ a combination of any means known in the art for manipulating photonic beams. While the discussion above generally focuses on various diffractive beam forming means, refractive and/or reflective beam forming means may be used as well. As alluded to above, invention may be applied to lasers with stable or unstable cavities. An exemplary $CO_2$ lasers suitable for use with the invention is available from TRUMPF Laser- and Systemtechnik GmbH (Ditringen, Germany).

Upon routine experimentation, those skilled in the art may find that the invention may be incorporated into existing equipment. For example, the above described spatial filter can be placed immediately after the laser or close to the substrate. Depending on the location of the filter, appropriate telescoping and/or relaying techniques may be used. In addition, auxiliary subsystems known in the art may be used to stabilize the position and the width of the laser beam relative to the optical system.

Furthermore, it should be emphasized that a temperature-feedback-based controller, e.g., a servo-controller, may be advantageously used. For example, one may measure the temperature profile on a wafer with high resolution and use the measurements to correct the beam profile. In some instances, such temperature measurement corrections may be carried out in real-time. In addition, temperature measurements may be made to generate a high-resolution map reflecting the thermal conditions under which the wafer was processed. For example, a map of the peak temperature reached at each point on the wafer may be generated. Such mapping may be carried out with a resolution in about the millimeter to the micrometer range. Such mapping may provide invaluable insight for further improvements in the art of thermal processing, particularly in the area of quality control and throughput.

It is to be understood that, while the invention has been described in conjunction with the preferred specific embodiments thereof, the foregoing description is intended to illustrate and not limit the scope of the invention. Any aspects of the invention discussed herein may be included or excluded as appropriate. For example, beam combining technologies and beam shaping technologies may be used by themselves or in combination. Other aspects, advantages, and modifications within the scope of the invention will be apparent to those skilled in the art to which the invention pertains.

All patents and patent applications mentioned herein are hereby incorporated by reference in their entireties to an extent not inconsistent with the above disclosure.

What is claimed is:

1. A method for modifying a coherent photonic beam having a wavelength ($\lambda$), an initial width (2a), and an initial intensity profile across the width, comprising the steps of:
    (a) producing the coherent photonic beam from a laser having:
        a laser cavity that is unstable in at least one direction and
        a laser output opening defined at least in part by parallel sides spaced apart from each other at a distance equaling the initial width of the beam and oriented in the at least one unstable direction; and (b) passing the beam from the output opening through a relay having a Fourier plane containing a spatial filter having a filter aperture that is sized, shaped and positioned to modify the beam such that a filtered image of the laser output opening is produced at a substrate, the filtered image at the substrate having a modified intensity profile in the at least one unstable direction that more closely approximates a super-Gaussian profile than the initial intensity profile.

2. The method of claim 1, wherein
the laser cavity is approximately flat in at least two orthogonal directions,
the laser output opening is rectangular or elliptical in shape with dimensions that correspond to the initial beam width, and
the modified intensity profile of the beam image at the substrate more closely approximates a super-Gaussian profile than the initial intensity profile in the at least two orthogonal directions.

3. The method of claim 2, wherein the initial intensity profile of the beam at the laser output opening is substantially flat.

4. The method of claim 1, wherein the laser output opening is sized, shaped and positioned to ensure that the initial intensity profile the beam at the laser output opening in the unstable direction and normal to the parallel sides is substantially uniform and the direction normal to the parallel sides corresponds to an unstable direction of the laser cavity.

5. The method of claim 1, the laser is a $CO_2$ laser.

6. The method of claim 1, wherein the relay includes two lenses positioned at an optical path distance from the radiation source opening and adapted to produce an image from the radiation source opening on the substrate, the relay containing a Fourier plane associated with a focal length (f) corresponding to about half of the optical path distance and the spatial filter is effective to shape the beam and thereby producing the modified intensity profile.

7. The method of claim 1, wherein the Fourier plane is associated with a focal length (f), and the filter aperture is defined at least in part by two opaque parallel edges spaced apart from each other by a distance equal to about $2.48\,\lambda f/2a$ in a direction corresponding to the laser output opening.

8. The method of claim 1, further comprising, after step (b) the step of:
(c) scanning an image produced from the modified photonic beam across a surface of the substrate to heat at least a portion of the substrate at and/or near the surface to achieve a desired maximum temperature within a predetermined dwell time.

9. The method of claim 8, wherein the desired maximum temperature is an annealing temperature sufficient to electrically activate dopant atoms implanted into a semiconductor material.

10. The method of claim 8, wherein the desired temperature is at least about 1200° C.

11. The method of claim 8, wherein the predetermined dwell time is no longer than about 3 milliseconds.

12. The method of claim 8, wherein the substrate surface has a Brewster's angle for the beam and the beam is incident to the substrate surface at or near the Brewster's angle.

13. The method of claim 8, wherein the modified intensity profile has a useful portion of substantially uniform intensity that contains no less than about 15% of total beam energy.

14. The method of claim 8, wherein the modified image has an elongate shape characterized by a length and width, the modified image exhibits intensity variations across the width of the image, the intensity variations across the width of the image as a function of the position along the length of the image is integrated to define the modified intensity profile, and the modified intensity profile is uniform over an extent comprising more than 15% of the total energy in the beam.

15. The method of claim 1, wherein a single photonic beam is produced in step (a).

16. The method of claim 1, wherein the beam is temporally continuous.

17. The method of claim 9, wherein the beam appears to be temporally continuous when the intensity is integrated over a time span equal to the dwell time.

18. A method for processing a semiconductor substrate having a surface, comprising the steps of:
(a) generating a photonic beam having an initial intensity profile;
(b) transmitting the beam through an imaging relay;
(c) diffractively filtering the beam through a spatial filter at a Fourier plane in the relay having an aperture size, shape, and location effective shape the beam and to form a filtered image on the substrate such that the image exhibits an intensity profile more approximates a super-Gaussian profile than the initial intensity profile of the beam; and
(d) scanning the image across the substrate surface to heat at least a portion of the substrate at and/or near the surface to achieve a desired maximum temperature within a predetermined dwell time.

19. A method for processing a semiconductor substrate having a surface, comprising the steps of:
(a) generating an initial photonic beam having an initial intensity profile associated with a putative unmodified image unsuitable for scanning across the substrate surface to heat at least a portion of the substrate at and/or near the surface to achieve a desired temperature within a predetermined dwell time;
(b) transmitting the beam through an imaging relay;
(c) diffractively filtering the initial photonic beam through a spatial filter at a Fourier plane in the relay having an aperture size, shape, and location effective to shape the beam and thereby producing a filtered image on the substrate having an intensity profile that more closely approximates a super-Gaussian profile than the initial intensity profile; and
(d) scanning the filtered image across the substrate surface to heat at least the portion of the substrate at and/or near the surface to achieve the desired temperature within the predetermined dwell time.

20. A laser-beam apparatus, comprising:
a laser that produces a coherent photonic beam, wherein the laser has a cavity that is unstable in at least one direction, and the beam has an initial intensity profile of a substantially uniform intensity distribution in the unstable direction measured at a relay position; and
a relay positioned at the relay position for receiving the beam, the relay having a Fourier plane containing a spatial filter that has an aperture size and shape effective to modify the beam in a direction corresponding to the unstable direction such that a filtered image is produced on a substrate has a modified intensity profile in the unstable direction that more closely approximates a super-Gaussian profile than the initial profile.

21. An apparatus for processing a substrate having a surface, comprising:
a radiation source adapted to emit a photonic beam;
a stage adapted to support a substrate having a surface;
a relay adapted to image the radiation source on the substrate, the relay having a Fourier plane containing a spatial filter having an aperture size, shape, and location effective to shape the beam and thereby producing an image having a filtered intensity profile at the substrate that more closely approximates a super-Gaussian profile than the initial intensity profile; and a controller operably coupled to the radiation source and the stage, wherein the controller is programmed to provide relative movement between the stage and the beam to scan the image across the substrate surface to heat at least a portion of the substrate at and/or near the surface to achieve a desired maximum temperature within a predetermined dwell time.

22. An apparatus for processing a substrate having a surface, comprising:

a radiation source adapted to emit a photonic beam of wavelength ($\lambda$), having a Gaussian distribution of intensity in at least one direction from a radiation output opening about a peak beam intensity;

a radiation source opening positioned to modify the Gaussian distribution;

a stage adapted to support a substrate having a surface;

a two-lens relay positioned at an optical path distance from the radiation source opening adapted to produce an image from the radiation source opening on the substrate, the relay containing a Fourier plane associated with a focal length (f) corresponding to about half of the optical path distance;

a spatial filter at the Fourier plane having an aperture size, shape, and location effective to shape the beam and thereby producing a filtered intensity profile at the substrate that more approximates super-Gaussian profile than the initial intensity profile; and a controller operably coupled to the radiation source and the stage, wherein the controller is programmed to provide relative movement between the stage and the beam to scan the beam image across the substrate surface to heat at least a portion of the substrate at and/or near the surface to achieve a desired temperature within a predetermined dwell time.

23. The apparatus of claim 22, wherein the radiation source opening of has a width of 2a and is positioned to clip portions of the beam exhibiting an intensity less than about 65% of the peak beam intensity.

24. The apparatus of claim 23, wherein the filter positioned to clip portions of the beam outside an alternating electric field distribution of the beam at about r=±1.54, where r=$\lambda$f/2a.

* * * * *